(12) United States Patent
Nicklaus et al.

(10) Patent No.: US 11,579,206 B2
(45) Date of Patent: Feb. 14, 2023

(54) METHOD AND DEVICE FOR ESTIMATING THE STATE OF HEALTH OF AN EXCHANGEABLE RECHARGEABLE BATTERY

(71) Applicant: Robert Bosch GmbH, Stuttgart (DE)

(72) Inventors: Mischa Nicklaus, Stuttgart (DE); Andreas Gonser, Wolfschlugen (DE); Marc-Alexandre Seibert, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/275,062

(22) PCT Filed: Nov. 11, 2019

(86) PCT No.: PCT/EP2019/080845
§ 371 (c)(1),
(2) Date: Mar. 10, 2021

(87) PCT Pub. No.: WO2020/108970
PCT Pub. Date: Jun. 4, 2020

(65) Prior Publication Data
US 2022/0057453 A1    Feb. 24, 2022

(30) Foreign Application Priority Data
Nov. 26, 2018    (DE) .......................... 102018220251.6

(51) Int. Cl.
*G01R 31/392*    (2019.01)
*G01R 31/389*    (2019.01)
(Continued)

(52) U.S. Cl.
CPC ......... *G01R 31/392* (2019.01); *G01R 31/374* (2019.01); *G01R 31/389* (2019.01);
(Continued)

(58) Field of Classification Search
None
See application file for complete search history.

(56) References Cited

U.S. PATENT DOCUMENTS

| 2006/0186890 A1* | 8/2006 | Iwane | .................. G01R 31/392 |
| | | | 324/426 |
| 2013/0110428 A1* | 5/2013 | Sun | .................... G01R 31/3842 |
| | | | 702/63 |

(Continued)

FOREIGN PATENT DOCUMENTS

| DE | 10056971 A1 | 5/2002 |
| EP | 3109654 A1 | 12/2016 |
| WO | 2014196933 A1 | 12/2014 |

OTHER PUBLICATIONS

International Search Report for PCT/EP2019/080845, dated Jan. 22, 2020.

*Primary Examiner* — Jas A Sanghera
(74) *Attorney, Agent, or Firm* — Norton Rose Fulbright US LLP; Gerard Messina (57) ABSTRACT

A method for estimating the state of health of an exchangeable rechargeable battery. The method includes: i. determining a remaining capacity of the battery during a charging operation, in such a manner, that a first charging value is ascertained by measuring an open-circuit voltage, as long as no charging current or only a minimal charging current is flowing; at least one further charging value is ascertained by measuring the charging current in specific time intervals, until the charging operation is completed; and a sum of the ascertained charging values is calculated; ii. determining a remaining performance of the battery during the charging operation in such a manner, that after a predefined battery voltage is reached, the charging current is briefly changed, and the respective battery voltage is measured; and an impedance of the battery is calculated from the quotient of (Continued)

the difference of the measured charging currents and battery voltages.

11 Claims, 3 Drawing Sheets

(51) Int. Cl.
    *G01R 31/3835*     (2019.01)
    *G01R 31/374*     (2019.01)
    *H02J 7/00*     (2006.01)

(52) U.S. Cl.
    CPC .......... *G01R 31/3835* (2019.01); *H02J 7/005* (2020.01); *H02J 7/0044* (2013.01); *H02J 7/0048* (2020.01); *H02J 7/007182* (2020.01)

(56) References Cited

U.S. PATENT DOCUMENTS

| | | | |
|---|---|---|---|
| 2015/0309122 A1* | 10/2015 | Rajamaki | G01R 31/389 324/430 |
| 2018/0088181 A1 | 3/2018 | Jiang et al. | |
| 2018/0097370 A1 | 4/2018 | Kim | |

\* cited by examiner

METHOD AND DEVICE FOR ESTIMATING THE STATE OF HEALTH OF AN EXCHANGEABLE RECHARGEABLE BATTERY

FIELD

The present invention relates to a method for estimating the state of health of an exchangeable rechargeable battery, in particular, of an exchangeable rechargeable battery pack for electric power tools, as well as to a battery charger and an exchangeable rechargeable battery for implementing the method.

BACKGROUND INFORMATION

Rechargeable batteries are used in many areas, either permanently integrated in the device, or as an exchangeable rechargeable battery and/or exchangeable rechargeable battery pack. Generally, exchangeable rechargeable batteries are provided by the manufacturer for a specific use. However, exchangeable rechargeable batteries of the same power or voltage class may often be used for a variety of different devices, as well. This is the case, in particular, in the area of electric power tools, household appliances and garden tools. In the following, the terms battery, rechargeable battery, exchangeable rechargeable battery, or exchangeable rechargeable battery pack are to be understood as synonymous with regard to their technology and in the scope of the present invention.

The following parameters are characteristic of rechargeable batteries:

- The cell technology (chemistry) used, such as Li-ion, Li-polymer, Li-metal, Ni—Cd, Ni-MH, etc.
- The voltage (maximum/nominal/minimum voltage). It follows from the cell technology and from the number of battery cells, which are connected in series in the rechargeable battery.
- The capacity. This is typically specified in ampere hours (Ah) and indicates the charge that the battery may contain. It is calculated from the ampere-hour capacity of a single battery cell and from the number of battery cells, which are connected in parallel in the rechargeable battery. At a given battery voltage, a higher capacity means that the battery may store more energy.
- The performance. It is indicated, for example, as the maximum current that the battery may supply. Since the battery cells warm up in response to high currents and may only be operated in a particular temperature range, the performance of the battery may also be described by a current, which the battery may supply for a particular time or until completely discharged. The performance is a very strong function of the impedance (internal resistance) of the battery.

Capacity and performance may change over the service life of the rechargeable battery due to different ageing mechanisms. A rechargeable battery typically decreases in capacity and performance in the course of its life cycle, which has a direct influence on its "physical condition." The acute physical condition of a rechargeable battery is often referred to as its "state of health" (SOH).

Different methods for estimating the SOH are described in U.S. Patent Application Publication No. US 2018/0097370 A1, PCT Application No. WO 2014/196933 A1 and U.S. Patent Application Publication No. US 2018/0088181 A2. However, the estimation of the state of health of exchangeable rechargeable batteries is associated with further difficulties, since their respective loadings and performance requirements differ greatly for some different devices and uses. To be sure, it is possible to measure the discharging current in the device and the charging current in the battery charger, but as a rule, the exact state of charge, at which the exchangeable rechargeable battery is plugged into the device or into the battery charger, is not known. Therefore, it is not possible to measure the remaining capacity precisely. Measuring the current directly in the exchangeable rechargeable battery would indeed be an alternative, but one having a high space requirement and associated with high costs, if the currents to be measured are high, which is the case, in particular, with heavy-duty electric power tools. If an exchangeable rechargeable battery is additionally intended to be suitable for a plurality of different devices, then this renders the estimation of the SOH considerably more difficult. Due to the different power requirements of the devices, the ageing of an exchangeable rechargeable battery may have several consequences:

- Diminished remaining capacity. In this case, the expected operating time of a device may no longer be attained.
- Decreased remaining performance due to an increase in the internal resistance. In this case, some devices (e.g., heavy-duty tools, such as angle grinders) only operate at reduced power or not at all.

An object of the present invention is to enable a precise estimation of the state of health of exchangeable rechargeable batteries during a charging operation. The subject matter of the present application also includes a battery charger and an exchangeable rechargeable battery, in particular, an exchangeable rechargeable battery pack for electric power tools, for carrying out the estimation of the SOH in accordance with the present invention.

SUMMARY

The present invention relates to a method for estimating the state of health of an exchangeable rechargeable battery, in particular, of an exchangeable rechargeable battery pack for electric power tools. In accordance with an example embodiment of the present invention, the following method steps are provided:

i. Determining a remaining capacity of the exchangeable rechargeable battery during a charging operation in such a manner, that
   a first charging value is ascertained by measuring an open-circuit voltage, as long as no charging current is still flowing or only a minimal charging current is flowing;
   at least one further charging value is ascertained by measuring the charging current in specific time intervals, until the charging operation is completed; and
   a sum of the ascertained charging values is calculated;

ii. Determining a remaining performance of the exchangeable rechargeable battery during the charging operation in such a manner, that
   after a predefined battery voltage is reached, the charging current is briefly changed, and the respective battery voltage is measured; and
   an impedance of the exchangeable rechargeable battery is calculated from the quotient of the difference of the measured charging currents and battery voltages.

Since, generally, the procurement of new exchangeable rechargeable batteries is associated with high costs for the user, it is particularly advantageous for him/her, if the method of the present invention provides him/her information as continuously as possible about the ageing of an exchangeable rechargeable battery, in order, therefore, to be able to plan for its replacement more effectively. In addition, it is equally advantageous for the user to know the respective capacity and performance of his/her exchangeable rechargeable batteries. In this manner, depending on the power requirement or operating time of the different devices, he/she may assign the individual, exchangeable rechargeable batteries to a correspondingly suitable use. This is particularly advantageous for companies and tradesmen, who use a large number of electric power tools and exchangeable rechargeable battery packs.

Today's exchangeable rechargeable battery packs for electric power tools typically contain lithium-ion cells (Li-ion), which are charged, generally, by common battery chargers, using a so-called CCCV method (constant-current, constant-voltage). In this context, charging circuitry of the battery charger generates a constant charging current through the rechargeable battery pack (constant current, CC), so that the battery voltage increases. As soon as the maximum battery voltage is attained, this is held constant by the charging circuitry (constant voltage, CV), and the charging current is reduced. If a predefined minimum value of the charging current is reached, then the charging circuitry ends the charging operation, and the battery cells are fully charged. The transition from the CC to the CV phase takes place typically at a state of charge of approximately 80%. Since the CCCV method is conventional to one skilled in the art, it will not be discussed in further detail in the following.

First of all, any device for processing workpieces with the aid of an electrically-powered, insertable tool is to be understood as a battery-operated "electric power tool." Thus, the electric power tool may take the form of a handheld electric power tool or a stationary electric machine tool. In this connection, typical electric power tools include handheld drills or drill presses, screwdrivers, impact drills, planers, angle grinders, orbital sanders, polishing machines, or the like. However, in the scope of the present invention, gardening tools, such as grass trimmers, pruning saws or the like, may also be subsumed under the term, electric power tool. Furthermore, devices, which are typically used at construction sites, are to be understood as electric power tools. Examples of these include fans, pumps, mixers, etc. The present invention may equally be used for exchangeable rechargeable batteries of battery-operated household appliances, such as vacuum cleaners, portable hotplates, mixers, etc.

The exchangeable rechargeable battery packs described herein typically include a housing, which is detachably connectible to the electric power tool or the battery charger via a mechanical interface in a force-locked and/or form-locked manner. In addition, the exchangeable rechargeable battery pack includes at least one battery cell and an electrical interface, via which the at least one battery cell is electrically connectible to the electric power tool or the battery charger. The battery cell may take the form of a galvanic cell, which has a structure, in which one cell pole comes to rest at one end and a further cell pole comes to rest at an opposite end. In particular, the battery cell has a positive cell pole at one end and a negative cell pole at an opposite end. The battery cells preferably take the form of lithium-based battery cells, e.g., Li-ion, Li—Po, Li-metal or the like. However, the present invention is also applicable to Ni—Cd cells, Ni-MH cells or other suitable types of cells.

Generally, the battery voltage of the exchangeable rechargeable battery pack is a multiple of the voltage of a single battery cell and results from the interconnection configuration (parallel or series) of the battery cells. Thus, in common Li-ion battery cells having a cell voltage of 3.6 V, battery voltages of 3.6 V, 7.2 V, 10.8 V, 14.4 V, 18 V, 36 V, etc., are produced by way of example. The battery cell preferably takes the form of a round, at least substantially cylindrical cell; the cell poles being situated at ends of the cylindrical shape. The electrical interface includes, in particular, at least two electrical contact elements, which are designed to transmit power. However, as an alternative, the electrical interface may also include a secondary charging-coil element for inductive charging. In addition, the electrical interface may include further contact elements that are designed to transmit information items, which are preferably ascertained via electronics integrated in the exchangeable rechargeable battery pack, to the electric power tool and/or the battery charger. In this context, in addition to the state of health, they may also include, for example, a state of charge of the exchangeable rechargeable battery pack, a temperature inside of the exchangeable rechargeable battery pack, a code or a remaining capacity of the exchangeable rechargeable battery pack.

In one particular embodiment of the present invention, the charging operation is carried out, using the CCCV method; the first charging value being ascertained prior to the CC phase, and the further charging values being ascertained during the CC phase and the CV phase, in order to determine the remaining capacity. Therefore, the open-circuit voltage is measured prior to the CC phase, and subsequently, so-called Coulomb counting, which measures the number of electrons in order to determine the charge in the rechargeable battery, is carried out.

The remaining performance of the exchangeable rechargeable battery is preferably determined only during the CC phase, in that after the predefined battery voltage is reached, the charging current is reduced from a first value to a second value for a certain time span. In addition, in each instance, in order to determine the remaining performance of the exchangeable rechargeable battery, a waiting time after the change in the charging current may elapse, until the battery voltage is measured. Furthermore, the determination of the remaining performance is repeated at regular intervals during the charging operation, in particular, during the CC phase.

In addition, a temperature of the exchangeable rechargeable battery is measured in a further method step. The calculated impedance of the exchangeable rechargeable battery may then be corrected with the aid of the measured temperature. This is particularly advantageous, since the temperature has a large effect on the impedance of the exchangeable rechargeable battery and, therefore, a direct effect on its current state of health, as well.

The increase in the impedance over time is an effect of the aging of the battery cells. However, the impedance of the conducting elements (contacts, circuit traces, wire, etc.) in the exchangeable rechargeable battery or in the battery charger changes only negligibly. Thus, it is particularly advantageous to carry out the voltage measurements directly in the exchangeable rechargeable battery, in order to ignore the impedances of the conducting elements. Either the individual cell voltages or the total battery voltage may be measured.

This impedance measurement may take place either once or several times during the charging operation. A plurality of measurements allow a plausibility check and, therefore, prevention of measuring errors, but also a more precise and detailed estimate.

The remaining capacity, the remaining performance, and/or the state of health of the exchangeable rechargeable battery may be outputted on a display unit in a particularly advantageous manner. In this context, both a display (LCD, OLED, ePaper or the like) and an LED indicator of the exchangeable rechargeable battery and of the battery charger, or, alternatively or additionally, a smartphone, tablet, PC or the like, may be used as a display unit. The communication between the exchangeable rechargeable battery and the above-mentioned display devices takes place via a suitable communications interface. In this context, a proprietary bus may also be used, such as transmission per standard protocols by wire or wirelessly.

The present invention also relates to a battery charger, as well as to an exchangeable rechargeable battery, in particular, an exchangeable rechargeable battery pack for electric power tools, for implementing the method according to the present invention.

BRIEF DESCRIPTION OF THE DRAWINGS

Below, the present invention is explained by way of example in light of FIGS. 1 through 4, where identical reference characters in the figures indicate the same components having the same method of functioning.

DETAILED DESCRIPTION OF EXAMPLE EMBODIMENTS

Figure 1:
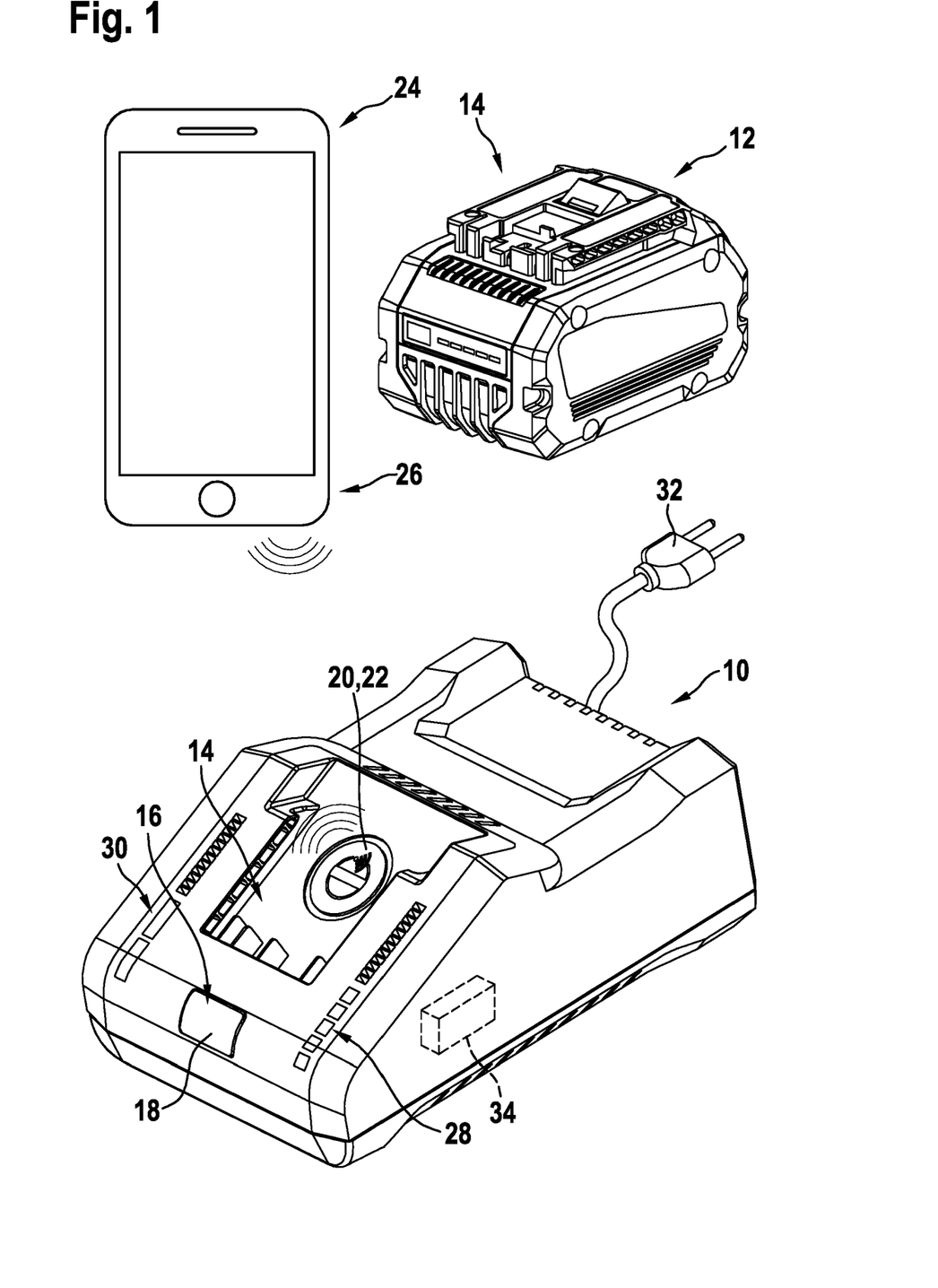
FIG. 1 shows a system made up of an exchangeable rechargeable battery pack for an electric power tool (not shown), a battery charger for charging the exchangeable rechargeable battery pack, as well as an external device in the form of a smartphone; in particular, the battery charger and exchangeable rechargeable battery pack being used for implementing the method of the present invention.

FIG. 1 shows a battery charger 10 for charging an exchangeable rechargeable battery pack 12 for an electric power tool not shown. The use of exchangeable rechargeable battery packs for different electric power tools is sufficiently conventional to one skilled in the art, so that it will not be discussed here in further detail.

To charge exchangeable rechargeable battery pack 12, its electromechanical interface 14 is plugged into a corresponding electromechanical interface 14 of battery charger 10, so that power is transmitted from battery charger 10 to exchangeable rechargeable battery pack 12. At the same time, data regarding the charging parameters, such as temperature, state of charge, remaining capacity, and the like, and/or regarding the state of health of exchangeable rechargeable battery pack 12, may be transmitted via electromechanical interfaces 14. The design of electromechanical interfaces 14 of the rechargeable battery pack, battery charger and electric power tool for, on one hand, powering electric power tool electrically and, on the other hand, charging exchangeable rechargeable battery pack 12 with the aid of battery charger 10, are conventional to one skilled in the art, so that this will not be discussed in further detail, in particular, since this is not of further significance to the present invention, as such. In addition, it is noted that the present invention is also applicable, without limitation, to battery chargers and exchangeable rechargeable batteries operating wirelessly, in particular, inductively.

For example, different charging modes may be set on battery charger 10 by a user, with the aid of an operating unit 16. In this context, one may distinguish between a "standard" mode (as a rule, the CCCV charging method), a "boost" mode having an increased charging current and very short charging time, a "long-life" mode having a particularly low charging current and very long charging time, a "storage" mode having a low charging current and extended charging time, as well as a "flight" mode having a charging current and a charging time corresponding to the "storage" mode, but, in contrast, a reduced charging limit. The individual charging modes are mentioned here only as examples and do not limit the present invention. In addition, operating unit 16 is used as an indicator 18 of the charging mode currently set, using one or more LED's and/or a display having different colors and/or flashing frequencies.

Using an interface 20, which, as mentioned previously, may take the form of a wireless interface 22 (e.g., Bluetooth, WLAN, NFC, Zigbee, LoRa, GSM, UMTS or the like), but also as a wired interface (e.g., USB, Ethernet, Thunderbolt, Lightning, RS232 or the like) of electromechanical interface 14, it is alternatively or additionally possible for the user to switch over the charging mode with the aid of an external device 24 (e.g., smartphone, tablet, PC, remote control, etc.) having a corresponding counterinterface 26. Furthermore, with the aid of interfaces 20, 22, 26, the user receives an acknowledgment, on external device 24, of the charging mode currently set, the charging parameters mentioned above, and/or the state of health of exchangeable rechargeable battery pack 12.

Battery charger 10 also includes a charging-state indicator 28, which is divided up into a plurality of display segments for different charging-state ranges (e.g., 20%, 40%, 60%, 80%, 100%). Consequently, the user may discern the state of charge of inserted, exchangeable rechargeable battery pack 12 rapidly and simply. Charging-state indicator 28 may be designed in such a manner, that in each instance, all of the segments are utilized for displaying the charging mode currently set. Alternatively, it is, however, also possible for the segments to always refer to the state of complete charge of the exchangeable rechargeable battery pack 12 to be charged; the end of a charging operation of the charging mode currently set then being able to be indicated, for example, by the flashing or a different color of a single segment or a plurality of segments, up to the current charging limit. Using a status indicator 30, battery charger 10 may signal, to the user, any faults in battery charger 10 and/or in exchangeable rechargeable battery pack 12, such as an overly high temperature or critical termination of the charging operation, but also a critical state of health of exchangeable rechargeable battery pack 12. Indicators 18, 28, 30 may be implemented, using a monochrome or polychrome LED, LCD and/or OLED elements, ePaper, or the like. In addition, or as an alternative, individual or all indicators 18, 28, 30 may also be implemented as acoustic and/or haptic transducers. In this context, for example, a loudspeaker, in particular, piezoelectric loudspeaker, is considered as an acoustic transducer, and a vibration transmitter in the form of an electric motor having an unbalanced disk driven by it, is considered as a haptic transducer.

If electromechanical interface 14 of exchangeable rechargeable battery pack 12 is plugged into electromechanical interface 14 of battery charger 10, battery charger 10 starts the charging operation automatically upon insertion of a power plug 32 of battery charger 10 into a socket. When power plug 32 is inserted, the charging operation may also be started by plugging exchangeable rechargeable battery pack 12 into battery charger 10, and/or after manipulating operating unit 16. The charging operation is ended normally, when exchangeable rechargeable battery pack 12 is fully charged and/or the user removes exchangeable rechargeable battery pack 12 from battery charger 10. In addition, battery charger 10 ends the charging operation in the case of a detected fault, or upon reaching a critical state of health of exchangeable rechargeable battery pack 12.

In addition, it is possible to reset battery charger 10 to a factory state with the aid of interface 20 and/or operating unit 16. To that end, battery charger 10 includes a checking unit 34, for example, in the form of a microprocessor not shown but conventional to one skilled in the art; the checking unit having a corresponding reset function, which responds to the manipulation of operating unit 16.

Figure 2:
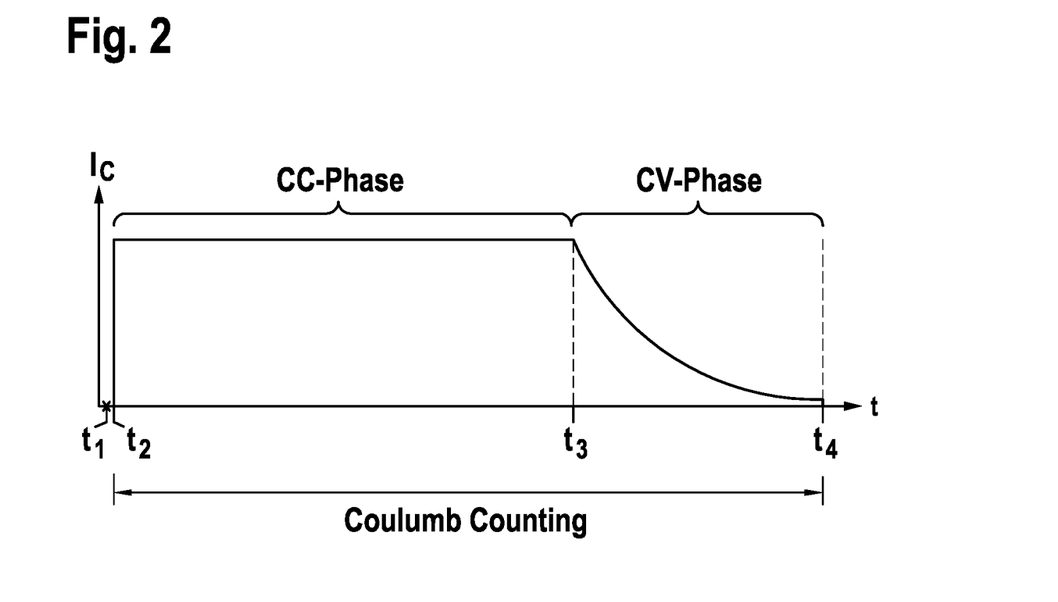
FIG. 2 shows a graph for illustrating a method of an example embodiment of the present invention in light of a CCCV charging method.

With the aid of FIG. 2, the method of the present invention for estimating the state of health shall now be explained on the basis of the remaining capacity and the performance of exchangeable rechargeable battery pack 12. In FIG. 2, the characteristic curve of charging current $I_C$ is plotted versus time t.

In a first method step I, the remaining capacity of exchangeable rechargeable battery pack 12 is determined during the charging operation in such a manner, that a first charging value $C_1$ is ascertained by measuring an open-circuit voltage $U_1$, as long as no charging current is still flowing or only a minimal charging current $I_C$ is flowing. After exchangeable rechargeable battery pack 12 has been plugged into battery charger 10, open-circuit voltage $U_1$ is measured at time $t_1$. This measurement may take place in battery charger 10 (direct measurement of the battery voltage) and/or in exchangeable rechargeable battery pack 12; either the total battery voltage or the cell voltages of the individual battery cells being measured. In light of open-circuit voltage $U_1$, the state of charge of exchangeable rechargeable battery pack 12 (for example, the charge in Ah,) prior to the actual charging operation may be ascertained, using a stored state-of-charge/open-circuit voltage curve, and/or with the aid of a corresponding look-up table. The relationship between state of charge and open-circuit voltage may vary a lot as a function of the rechargeable battery, which is why individual curves and/or tables for each exchangeable rechargeable battery pack 12 are useful.

Then, at least one further charging value $C_n$ is ascertained in specific time intervals, by measuring corresponding charging current $I_{Cn}$ until the charging operation is completed. To that end, the charging method starts at time $t_2$ after measurement of open-circuit voltage $U_1$. Battery charger 10 generates a charging current $I_C$, which is constant up to a maximum battery voltage (CC phase), and when the maximum battery voltage is attained at time $t_3$, the charging current is adjusted down, so that the battery voltage remains constant (CV phase).

During the entire charging operation, charging current $I_{Cn}$ is measured by battery charger 10 in specific intervals. These values are added up by the microcontroller of checking unit 34 in a counter. At the end of the charging operation at time $t_4$, battery charger 10 switches off as soon as charging current $I_C$ reaches a predefined minimum value $I_{CT}$ during the CV phase. The sum of the measured charging-current values $I_{Cn}$ then yields the complete charge $\Sigma_n C_n$ (for example, in Ah,) of exchangeable rechargeable battery pack 12. This method is also referred to as "Coulomb counting," since it measures the number of electrons. At the conclusion of first method step I, a sum of the ascertained charge values $C_1 + \Sigma_n C_n$ is finally calculated, in light of which the remaining overall capacity, which may still be loaded into exchangeable rechargeable battery pack 12, results.

In a further method step II, a remaining performance of exchangeable rechargeable battery pack 12 during the charging operation is determined in such a manner, that initially after a predefined battery voltage $U_{CT}$ is reached, charging current $I_C$ is changed briefly, and the respective battery voltage $U_C$ is measured. Subsequently, an impedance Z of exchangeable rechargeable battery pack 12 is calculated from the quotient of the difference of the measured battery voltages and charging currents.

Figure 3:
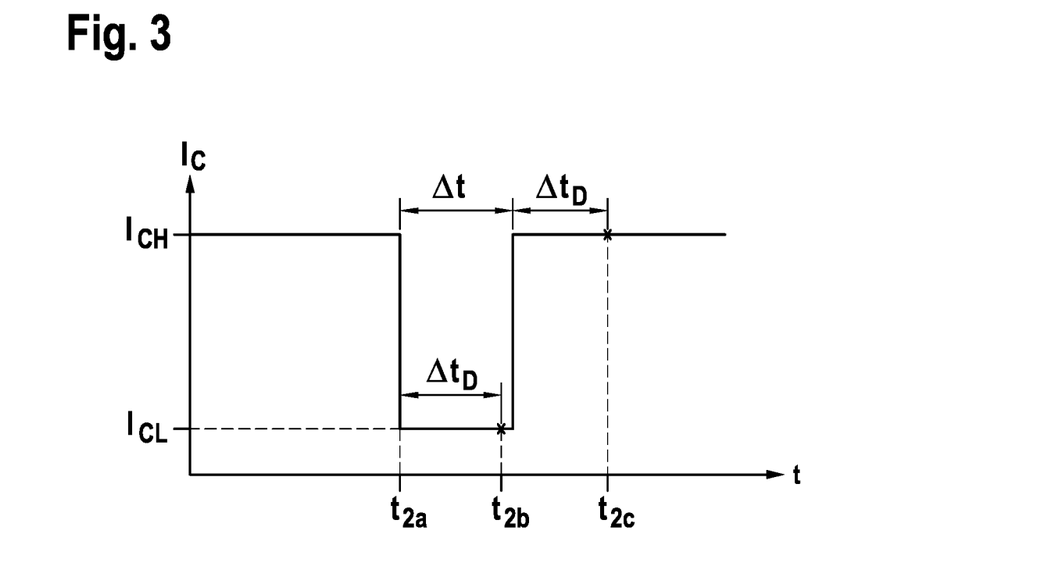
FIG. 3 shows a graph for illustrating the impedance measurement within the scope of the method according to an example embodiment of the present invention.

When predefined battery voltage $U_{CT}$ is reached, then, as shown in FIG. 3, during the CC phase (cf. FIG. 2), charging current $I_C$ is reduced at a time $t_{ea}$ from a first value $I_{CH}$ to a second, predefined value $I_{CL}$ for a particular time span $\Delta t$. After a brief waiting time $\Delta t_D$ has elapsed for relaxing the battery voltage (for example, a couple seconds), battery voltage $U_{C1}$ is measured a first time at time $t_{2b}$. After time span $\Delta t$ has elapsed, charging current $I_C$ is increased again to first value $I_{CH}$, and after the same waiting time $\Delta t_D$, battery voltage $U_{C2}$ is measured again at a time $t_{2c}$. Alternatively, the first measurement may also take place at first charging-current value $I_{CH}$, and the second measurement may take place at reduced charging-current value $I_{CL}$. In addition, it is not absolutely necessary for waiting times $\Delta t_D$ prior to times $t_{2b}$ and $t_{2c}$ to be equally long.

Since the two measurements are only a few seconds apart, the state of charge does not change or only changes negligibly. By calculating the quotient of the difference of the two battery voltage values $U_{C2} - U_{C1}$ and the corresponding charging-current values $I_{CH} - I_{CL}$, the impedance Z (strictly speaking, the d.c. impedance and/or the internal resistance) of exchangeable rechargeable battery pack 12 may finally be calculated approximately. In this context, the performance of exchangeable rechargeable battery pack 12 acts reciprocally to ascertained impedance Z. That is to say, the higher the calculated impedance Z, the lower the performance of exchangeable rechargeable battery pack 12. In addition, it must be taken into account that impedance Z of exchangeable rechargeable battery pack 12 increases with its age.

The following aspects may also be of significance in the calculation of impedance Z in battery charger 10:

Impedance Z of a rechargeable battery is a strong function of temperature. Therefore, it is useful to measure temperature T of exchangeable rechargeable battery pack 12 during the impedance calculation and to determine the performance on the basis of impedance Z, as a function of this temperature T.

The increase in impedance Z with increasing age of a rechargeable battery is an effect of the aging of the battery cells. However, the impedance of the conducting elements (contacts, circuit traces, wires, etc.) in exchangeable rechargeable battery pack 12 or in battery charger 10 changes only negligibly. Thus, it is particularly advantageous to carry out the voltage measurements directly in exchangeable rechargeable battery pack 12, in order to exclude influences of the impedances of the conducting elements. In this context, either the individual cell voltages or the total battery voltage of exchangeable rechargeable battery pack 12 may be measured.

Figure 4:
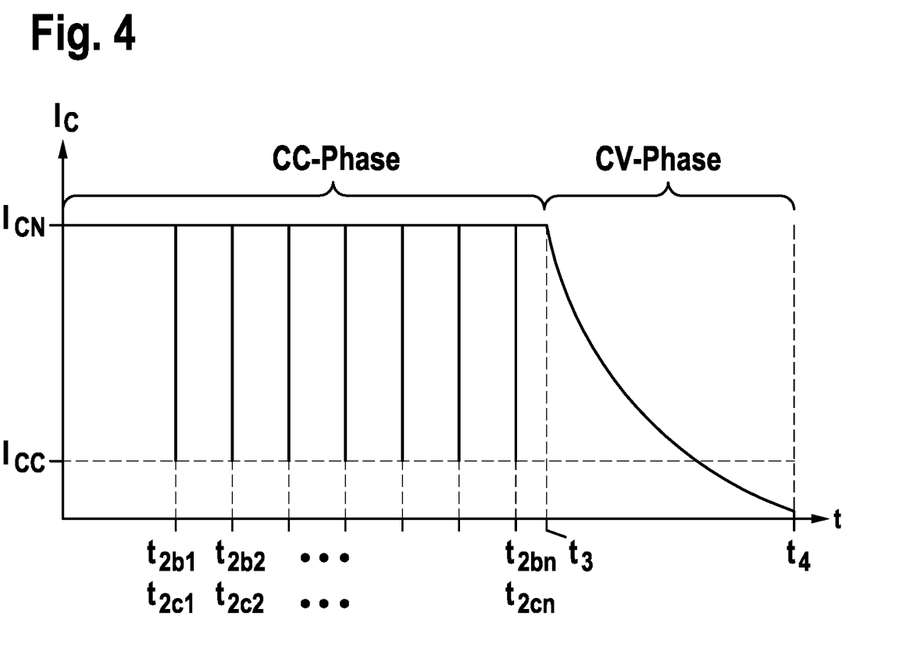
FIG. 4 shows a further graph for illustrating the impedance measurements within the scope of the method according to an example embodiment of the present invention.

As shown in FIG. 4, the impedance measurement explained above may also take place repeatedly during the charging operation, within the CC phase. A plurality of measurements at times $t_{2b1}, t_{2b2}, \ldots, t_{2bn}$ and $t_{2c1}$, $t_{2c2}, \ldots, t_{2cn}$ allow a plausibility check and, therefore, prevention of measuring errors, as well as the production of a precise and detailed estimation of the state of health of exchangeable rechargeable battery pack 12.

The measurements, which are necessary for the SOH estimation (e.g., voltages, temperature values, etc.), may be carried out in battery charger 10 or in the exchangeable rechargeable battery pack 12 to be charged. If they are carried out in exchangeable rechargeable battery pack 12, the ascertained values may be transmitted to battery charger 10 by a contact (e.g., wired) connection, via the interfaces 14 explained already in connection with FIG. 1, and/or by a contactless and/or wireless connection, via interfaces 20 and/or 22. The evaluation of the measurements is then possible either in battery charger 10 or, additionally and/or alternatively, in external device 24, via wireless interfaces 22 and 26. If the evaluation is performed in battery charger 10, the results may be outputted directly via charging-state indicator 28 and/or status indicator 30. If it is performed in external device 24, then an indication containing more details and explanations is possible via its display. Of course, it is equally possible to perform the calculation and evaluation in battery charger 10, in exchangeable rechargeable battery pack 12, or in external device 24, and to display the results, in each instance, in other device 10, 12 or 24. Since the evaluation is, as a rule, complex and a large quantity of data (stored curves and table for different exchangeable rechargeable battery packs) and resources (complex formulas) is needed, it is particularly advantageous for it to be carried out directly in external device 24. This saves the costs of processors and, possibly, space in battery charger 10, and more inexpensive microprocessors may be used as a checking unit 34. In addition, an evaluation in external device 24 allows subsequent optimization with the aid of data collections, for example, using updates of the application, which are installed in external device 24. In addition, data of exchangeable rechargeable battery packs 12, which did not yet exist at the time at which battery charger 10 was sold, may be stored later in external device 24. If the evaluation is carried out in battery charger 10, using a suitably powerful checking unit 34, then, of course, a data update is also possible via its interfaces 20, 22.

Finally, it should be pointed out that the exemplary embodiments shown are not limited to FIGS. 1 through 4 or to the CCCV charging method described. Thus, the present invention may also be used for other suitable charging methods having different charging curves. It is also possible to utilize more than only two different charging currents $I_{CH}$, $I_{CL}$ and battery voltages $U_{C1}$, $U_{C2}$ for determining impedance Z and/or the remaining performance of exchangeable rechargeable battery pack 12 at correspondingly suitable sampling times.

What is claimed is:

1. A method for estimating a state of health of an exchangeable rechargeable battery, the method comprising the following method steps:
   i. determining a remaining capacity of the exchangeable rechargeable battery during a charging operation, in such a manner, that:
      a first charging value is ascertained by measuring an open-circuit voltage, as long as no charging current is still flowing or only a minimal charging current is flowing;
      at least one further charging value is ascertained by measuring a charging current in specific time intervals, until the charging operation is completed; and
      a sum of the ascertained first and the at least one further charging values is calculated; and
   ii. determining a remaining performance of the exchangeable rechargeable battery during the charging operation in such a manner, that:
      after a predefined battery voltage is attained, the charging current is briefly changed, and a battery voltage is measured; and
      an impedance of the exchangeable rechargeable battery is calculated from a quotient of a difference of measured charging currents and measured battery voltages.

2. The method as recited in claim 1, wherein the exchangeable rechargeable battery is an exchangeable rechargeable battery pack for an electric power tool.

3. The method as recited in claim 1, wherein the charging operation is carried out, using a CCCV method, the first charging value is ascertained prior to a CC phase and the further charging values being ascertained during the CC phase and a CV phase, in order to determine the remaining capacity.

4. The method as recited in claim 1, wherein, to determine the remaining performance of the exchangeable rechargeable battery, in each instance, a waiting time after the change in the charging current elapses, until the battery voltage is measured.

5. The method as recited in claim 1, further comprising:
   measuring a temperature of the exchangeable rechargeable battery.

6. The method as recited in claim 5, wherein the calculated impedance of the exchangeable rechargeable battery is corrected based on the measured temperature.

7. The method as recited in claim 1, wherein the remaining capacity, and/or the remaining performance, and/or the state of health of the exchangeable rechargeable battery is output on an indicating unit.

8. A method for estimating a state of health of an exchangeable rechargeable battery, the method comprising the following method steps:
   i. determining a remaining capacity of the exchangeable rechargeable battery during a charging operation, in such a manner, that:
      a first charging value is ascertained by measuring an open-circuit voltage, as long as no charging current is still flowing or only a minimal charging current is flowing;
      at least one further charging value is ascertained by measuring a charging current in specific time intervals, until the charging operation is completed; and
      a sum of the ascertained first and the at least one further charging values is calculated; and
   ii. determining a remaining performance of the exchangeable rechargeable battery during the charging operation in such a manner, that:
      after a predefined battery voltage is attained, the charging current is briefly changed, and a battery voltage is measured; and
      an impedance of the exchangeable rechargeable battery is calculated from a quotient of a difference of measured charging currents and measured battery voltages,
      wherein the charging operation is carried out, using a CCCV method, the first charging value is ascertained prior to a CC phase and the further charging values being ascertained during the CC phase and a CV phase, in order to determine the remaining capacity, wherein the remaining performance of the exchangeable rechargeable battery is determined only during the CC phase, in that after the predefined battery voltage is reached, the charging current is reduced for a certain time span, from a first value to a second value.

9. A method for estimating a state of health of an exchangeable rechargeable battery, the method comprising the following method steps:
   i. determining a remaining capacity of the exchangeable rechargeable battery during a charging operation, in such a manner, that:
      a first charging value is ascertained by measuring an open-circuit voltage, as long as no charging current is still flowing or only a minimal charging current is flowing;
      at least one further charging value is ascertained by measuring a charging current in specific time intervals, until the charging operation is completed; and
      a sum of the ascertained first and the at least one further charging values is calculated; and
   ii. determining a remaining performance of the exchangeable rechargeable battery during the charging operation in such a manner, that:
      after a predefined battery voltage is attained, the charging current is briefly changed, and a battery voltage is measured; and
      an impedance of the exchangeable rechargeable battery is calculated from a quotient of a difference of measured charging currents and measured battery voltages,
      wherein the charging operation is carried out, using a CCCV method, the first charging value is ascertained prior to a CC phase and the further charging values being ascertained during the CC phase and a CV phase, in order to determine the remaining capacity,
      wherein the determination of the remaining performance is repeated at regular intervals during the charging operation, during the CC phase.

10. A battery charger configured to estimate a state of health of an exchangeable rechargeable battery, the battery charger configured to:
   i. determine a remaining capacity of the exchangeable rechargeable battery during a charging operation, in such a manner, that:
      a first charging value is ascertained by measuring an open-circuit voltage, as long as no charging current is still flowing or only a minimal charging current is flowing;
      at least one further charging value is ascertained by measuring a charging current in specific time intervals, until the charging operation is completed; and
      a sum of the ascertained first and the at least one further charging values is calculated; and
   ii. determine a remaining performance of the exchangeable rechargeable battery during the charging operation in such a manner, that:
      after a predefined battery voltage is attained, the charging current is briefly changed, and a battery voltage is measured; and
      an impedance of the exchangeable rechargeable battery is calculated from a quotient of a difference of measured charging currents and measured battery voltages.

11. An exchangeable rechargeable battery configured to estimate a state of health of the exchangeable rechargeable battery, the exchangeable rechargeable battery configured to:
   i. determine a remaining capacity of the exchangeable rechargeable battery during a charging operation, in such a manner, that:
      a first charging value is ascertained by measuring an open-circuit voltage, as long as no charging current is still flowing or only a minimal charging current is flowing;
      at least one further charging value is ascertained by measuring a charging current in specific time intervals, until the charging operation is completed; and
      a sum of the ascertained first and the at least one further charging values is calculated; and
   ii. determine a remaining performance of the exchangeable rechargeable battery during the charging operation in such a manner, that:
      after a predefined battery voltage is attained, the charging current is briefly changed, and a battery voltage is measured; and
      an impedance of the exchangeable rechargeable battery is calculated from a quotient of a difference of measured charging currents and measured battery voltages.

* * * * *